(12) United States Patent
Swenberg et al.

(10) Patent No.: US 10,580,643 B2
(45) Date of Patent: Mar. 3, 2020

(54) FLUORINATION DURING ALD HIGH-K, FLUORINATION POST HIGH-K AND USE OF A POST FLUORINATION ANNEAL TO ENGINEER FLUORINE BONDING AND INCORPORATION

(71) Applicant: Applied Materials, Inc., Santa Clara, CA (US)

(72) Inventors: Johanes S. Swenberg, Los Gatos, CA (US); Linlin Wang, Santa Clara, CA (US); Wei Liu, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 420 days.

(21) Appl. No.: 15/413,167

(22) Filed: Jan. 23, 2017

(65) Prior Publication Data

US 2017/0236702 A1    Aug. 17, 2017

Related U.S. Application Data

(60) Provisional application No. 62/295,714, filed on Feb. 16, 2016.

(51) Int. Cl.
*H01L 21/02*     (2006.01)
*H01L 21/28*     (2006.01)
*H01L 29/51*     (2006.01)

(52) U.S. Cl.
CPC ...... *H01L 21/0228* (2013.01); *H01L 21/0234* (2013.01); *H01L 21/02181* (2013.01);
(Continued)

(58) Field of Classification Search
CPC .......................... H01L 21/02337–0234; H01L 21/02142–02161; H01L 21/02175–02194; H01L 21/0228; H01L 21/02181; H01L 21/02148; H01L 21/02274; H01L 21/02271–0228; H01L 21/28185; H01L 21/28194–28211; H01L 29/517–518; H01L 21/28202; H01L 29/513; H01L 21/31604; H01L 21/02189; H01L 21/3105; H01L 21/02178; H01L 21/02252; H01L 21/3141; C26C 14/081–082; C26C 14/0676;
(Continued)

(56) References Cited

U.S. PATENT DOCUMENTS 8,735,305 B2   5/2014  Tong
8,791,003 B2   7/2014  Triyoso et al.
(Continued)

*Primary Examiner* — Zandra V Smith
*Assistant Examiner* — Jeremy J Joy
(74) *Attorney, Agent, or Firm* — Patterson + Sheridan LLP

(57) ABSTRACT

Embodiments of the present disclosure generally relate to methods for forming a high-k gate dielectric in a transistor. The high-k gate dielectric may be formed by introducing a fluorine containing gas into a processing chamber during the deposition of the high-k gate dielectric in the processing chamber. In one embodiment, the high-k gate dielectric is formed by an ALD process in a processing chamber, and a fluorine containing gas is introduced into the processing chamber during one or more stages of the ALD process. Fluorine ions, molecules or radicals from the fluorine containing gas (may be activated by a plasma) can fill the oxygen vacancies in the high-k dielectric.

20 Claims, 3 Drawing Sheets

(52) U.S. Cl.
CPC .. *H01L 21/02274* (2013.01); *H01L 21/02337* (2013.01); *H01L 21/28185* (2013.01); *H01L 21/28194* (2013.01); *H01L 29/517* (2013.01); *H01L 29/518* (2013.01)

(58) Field of Classification Search
CPC ....... C23C 16/32; C23C 16/405; C23C 16/56; C23C 16/403–405
See application file for complete search history.

(56) References Cited

U.S. PATENT DOCUMENTS

| | | | | |
|---|---|---|---|---|
| 2005/0032317 | A1* | 2/2005 | Sandhu | C23C 16/0236 438/287 |
| 2006/0105530 | A1* | 5/2006 | Lai | H01L 21/28185 438/287 |
| 2008/0076268 | A1* | 3/2008 | Kraus | H01L 21/28185 438/785 |
| 2008/0296704 | A1* | 12/2008 | Wakabayashi | H01L 21/265 257/410 |
| 2008/0311730 | A1* | 12/2008 | Oh | H01L 21/324 438/479 |
| 2012/0021610 | A1* | 1/2012 | Sandhu | C23C 16/0236 438/768 |
| 2012/0308739 | A1* | 12/2012 | Lansalot-Matras | C23C 16/30 427/569 |
| 2013/0267086 | A1* | 10/2013 | Erben | H01L 21/02181 438/585 |
| 2013/0313657 | A1* | 11/2013 | Tong | H01L 21/02181 257/411 |
| 2014/0127422 | A1* | 5/2014 | Shao | C23C 16/04 427/535 |

\* cited by examiner

(12)  United States Patent

FLUORINATION DURING ALD HIGH-K, FLUORINATION POST HIGH-K AND USE OF A POST FLUORINATION ANNEAL TO ENGINEER FLUORINE BONDING AND INCORPORATION

CLAIM OF PRIORITY UNDER 35 U.S.C. 119

This application claims priority to U.S. Provisional Patent Application Ser. No. 62/295,714, filed on Feb. 16, 2016, which herein is incorporated by reference.

BACKGROUND

Field

Embodiments of the present disclosure generally relate to methods for forming a dielectric material on a substrate, and more specifically, to methods for forming a high-k gate dielectric in an electronic device.

Description of the Related Art

Integrated circuits may include more than one million micro-electronic field effect transistors (e.g., complementary metal-oxide-semiconductor (CMOS) field effect transistors) that are formed on a substrate (e.g., semiconductor substrate) and cooperate to perform various functions within the circuit. A CMOS transistor includes a gate structure disposed between source and drain regions that are formed in the substrate. The gate structure generally includes a gate electrode and a gate dielectric. The gate electrode is disposed over the gate dielectric to control a flow of charge carriers in a channel region formed between the drain and source regions beneath the gate dielectric. Typically, dielectric materials, such as $SiO_2$, may be used as the gate dielectric. Recently, the gate dielectric may be formed from a material having a dielectric constant greater than 4.0, or high-k dielectric material, in order to increase the speed of the transistor. However, the high-k dielectric material has bulk traps caused by oxygen vacancies in the high-k dielectric material, leading to significant threshold voltage shift and device performance degradation.

Therefore, there is a need for a process to form dielectric materials, such as high-k dielectric materials.

SUMMARY

Embodiments of the present disclosure generally relate to methods for forming a high-k gate dielectric in a transistor. The high-k gate dielectric may be formed by introducing a fluorine containing gas into a processing chamber during the deposition of the high-k gate dielectric in the processing chamber. In one embodiment, the high-k gate dielectric is formed by an ALD process in a processing chamber, and a fluorine containing gas is introduced into the processing chamber during one or more stages of the ALD process. Fluorine ions, molecules or radicals from the fluorine containing gas (may be activated by a plasma) can fill the oxygen vacancies in the high-k dielectric.

In one embodiment, a method includes disposing a substrate in a processing chamber, flowing a first precursor into the processing chamber, forming a monolayer from the first precursor on the substrate, flowing a second precursor into the processing chamber, reacting the second precursor with the monolayer, forming a dielectric layer on the substrate, repeating flowing the first and second precursors into the processing chamber, forming the monolayer from the first precursor, and reacting the second precursor with the monolayer to grow the dielectric layer to a predetermined thickness, and exposing the dielectric layer to a fluorine containing gas during the growing of the dielectric layer.

In another embodiment, a method includes disposing a substrate in a processing chamber, flowing a first precursor into the processing chamber, forming a monolayer from the first precursor on the substrate, flowing a second precursor into the processing chamber, reacting the second precursor with the monolayer, forming a dielectric layer on the substrate, repeating flowing the first and second precursors into the processing chamber, forming the monolayer from the first precursor, and reacting the second precursor with the monolayer to grow the dielectric layer to a predetermined thickness, and exposing the dielectric layer to a fluorine containing plasma during the growing of the dielectric layer.

In another embodiment, a method includes disposing a substrate in a processing chamber, flowing two or more precursors and a fluorine containing gas into the processing chamber, and forming a fluorinated high-k dielectric layer on the substrate in the processing chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to methods for forming a high-k gate dielectric in a transistor. The high-k gate dielectric may be formed by introducing a fluorine containing gas into a processing chamber during the deposition of the high-k gate dielectric in the processing chamber. In one embodiment, the high-k gate dielectric is formed by an atomic layer deposition (ALD) process in a processing chamber, and a fluorine containing gas is introduced into the processing chamber during one or more stages of the ALD process. Fluorine ions, molecules or radicals from the fluorine containing gas (may be activated by a plasma) can fill the oxygen vacancies in the high-k dielectric.

Figure 1:
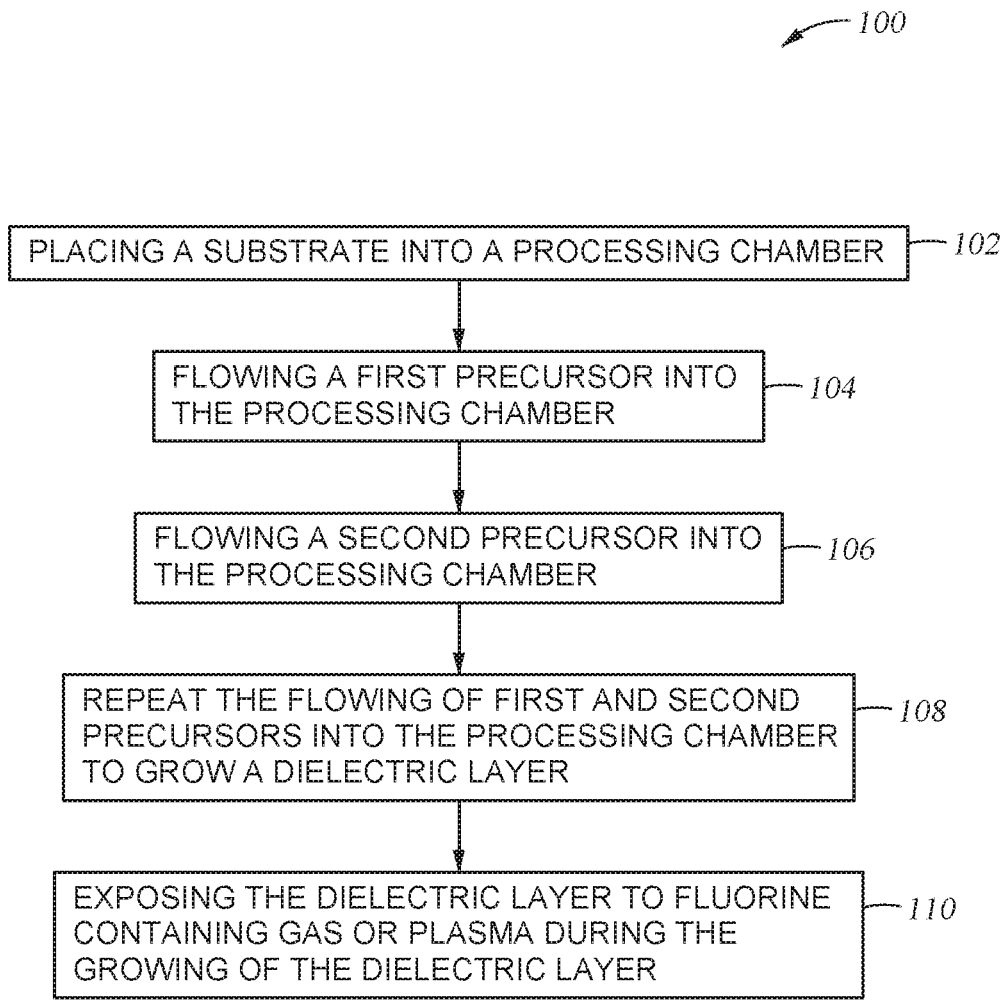
FIG. 1 illustrates operations of a method according to embodiments disclosed herein.

FIG. 1 illustrates operations of a method 100 according to embodiments disclosed herein. At operation 102, a substrate is placed into a processing chamber. The processing chamber may be any suitable chamber for forming a high-k dielectric material, such as a high-k gate dielectric or a high-k dielectric layer formed on an electrode of a capacitor in a DRAM device. The processing chamber may be an ALD chamber. The substrate may include a portion of a CMOS transistor, such as a channel region, and the high-k dielectric material is formed on the channel region, or a portion of a capacitor of a DRAM device, such as an electrode, and the high-k dielectric material is formed on the electrode. At operation 104, a first precursor is flowed into the processing chamber. The first precursor includes a metal precursor for forming a high-k material, such as hafnium, zirconium, titanium, tantalum, lanthanum, aluminum, silicon, or other suitable material. The first precursor may be free of fluorine. In one embodiment, the first precursor includes hafnium, such as hafnium tetrachloride ($HfCl_4$) or tetrakis(diethylamino)hafnium (($Et_2N)_4Hf$ or TDEAH). The first precursor may be introduced with a carrier gas, such as nitrogen. The first precursor may be pulsed into the processing chamber. The word "pulse" used herein is intended to refer to a quantity of a particular compound that is intermittently or non-continuously introduced into a reaction zone of a processing chamber. A monolayer of the first precursor may be formed on the substrate.

Next, at operation 106, a second precursor is flowed into the processing chamber. Prior to flowing the second precursor into the processing chamber, a purge process may be performed to remove any residual first precursor in the processing chamber. The purge process may include pulsing a purge gas, such as argon or nitrogen gas, into the processing chamber. The second precursor may be pulsed into the processing chamber. The second precursor includes species that react with the monolayer of the first precursor, such as oxygen. One exemplary second precursor is water vapor, which may be produced by a water vapor generator using an oxygen source gas and a hydrogen source gas. The oxygen source gas may include oxygen ($O_2$), atomic oxygen (O), ozone ($O_3$), nitrous oxide ($N_2O$), nitric oxide (NO), nitrogen dioxide ($NO_2$), dinitrogen pentoxide ($N_2O_5$), hydrogen peroxide ($H_2O_2$), derivatives thereof or combinations thereof, and the hydrogen source gas may include hydrogen ($H_2$), atomic hydrogen (H), forming gas ($N_2/H_2$), ammonia ($NH_3$), hydrocarbons (e.g., $CH_4$), alcohols (e.g., $CH_3OH$), derivatives thereof or combinations thereof. The second precursor may be free of fluorine. The second precursor reacts with the monolayer of first precursor disposed on the substrate to form a thin high-k dielectric layer. The high-k dielectric layer may include silicon oxynitrides ($SiO_xN_y$), hafnium containing materials, such as hafnium oxides ($HfO_x$ including $HfO_2$), hafnium silicates ($HfSi_xO_y$ including $HfSiO_4$), hafnium, silicon oxynitrides ($HfSi_xO_yN_z$), hafnium oxynitrides ($HfO_xN_y$), hafnium aluminates ($HfAl_xO_y$), hafnium aluminum silicates ($HfAl_xSi_yO_z$), hafnium aluminum silicon oxynitrides ($HfAl_wSi_xO_yN_z$), hafnium lanthanum oxides ($HfLa_xO_y$), zirconium containing materials, such as zirconium oxides ($ZrO_x$ including $ZrO_2$), zirconium silicates ($ZrSi_xO_y$ including $ZrSiO_4$), zirconium silicon oxynitrides ($ZrSi_xO_yN_z$), zirconium oxynitrides ($ZrO_xN_y$), zirconium aluminates ($ZrAl_xO_y$), zirconium aluminum silicates ($ZrAl_xSi_yO_z$), zirconium aluminum silicon oxynitrides ($ZrAl_wSi_xO_yN_z$), zirconium lanthanum oxides ($ZrLa_xO_y$), other aluminum-containing materials or lanthanum-containing materials, such as aluminum oxides ($Al_2O_3$ or $AlO_x$), aluminum oxynitrides ($AlO_xN_y$), aluminum silicates ($AlSi_xO_y$), aluminum silicon oxynitrides ($AlSi_xO_yN_z$), lanthanum aluminum oxides ($LaAl_xO_y$), lanthanum oxides ($LaO_x$ or $La_2O_3$), other suitable materials, composites thereof, and combinations thereof. Other high-K dielectric materials useful for dielectric layers may include titanium oxides ($TiO_x$ or $TiO_2$), titanium oxynitrides ($TiO_xN_y$), tantalum oxides ($TaO_x$ or $Ta_2O_5$) and tantalum oxynitrides ($TaO_xN_y$). The high-k dielectric layer may have a thickness in the range from about 0.5 Angstroms to about 10 Angstroms.

A purge process may be performed following forming the thin high-k dielectric layer. The flowing of the first precursor and the second precursor into the processing chamber may be a cycle, and the cycle may include the purge processes after flowing the first precursor into the processing chamber and after flowing the second precursor into the processing chamber. At operation 108, the flowing of first and second precursors into the processing chamber is repeated. In other words, the cycle is repeated to grow the high-k dielectric layer. The number of cycles is based on the thickness of the final high-k dielectric layer, or the thickness of the high-k gate dielectric. The number of repeating cycles may range from about 2 to 100, and the thickness of the high-k gate dielectric may range from about 1 Angstrom to about 1000 Angstroms, such as from about 20 Angstroms to about 40 Angstroms. The substrate may be heated and maintained at a temperature ranging from about 70 degrees Celsius to about 1000 degrees Celsius, such as from about 100 degrees Celsius to about 650 degrees Celsius, during operations 104 and 106. The processing chamber pressure may range from about 1 Torr to about 100 Torr, such as from about 1 Torr to about 20 Torr during operations 104 and 106.

In order to fill oxygen vacancies in the high-k dielectric, fluorine ions, molecules or radicals may be incorporated into the high-k dielectric during the deposition or growth of the high-k dielectric, i.e., operations 104, 106 and 108. In one embodiment, the high-k dielectric is deposited using ALD, as described above, and the high-k dielectric layer is exposed to a fluorine containing gas or plasma during the growing of the high-k dielectric layer, as shown at operation 110. For example, a fluorine containing gas may be flowed into the processing chamber between flowing of the first and second precursors into the processing chamber. In other words, the fluorine containing gas is flowed into the processing chamber one or more times during the growth of the high-k dielectric, and the high-k dielectric is exposed to the fluorine containing gas one or more times during the growth of the high-k dielectric. The fluorine containing gas may be any suitable gas, such as fluorine gas ($F_2$), tetrafluoromethane ($CF_4$), or nitrogen trifluoride ($NF_3$). The fluorine containing gas may be flowed into the processing chamber after a predetermined number of cycles or after a predetermined thickness has achieved. The fluorine containing gas may be flowed into the processing chamber between the flowing of the first and second precursors into the processing chamber, such as after the flowing of the first precursor but before the flowing of the second precursor, or after the flowing of the second precursor but before the flowing of the first precursor of the next cycle. The fluorine containing gas may be flowed into the processing chamber more than once during operations 104, 106 and 108. The number of occurrences of flowing the fluorine containing gas into the processing chamber may be based on the amount of fluorine ions, molecules or radicals to be incorporated into the high-k dielectric. In one embodiment, less than one percent by weight of the fluorine molecules, ions or radicals is incorporated in the high-k dielectric. Prior to and after the flowing of the fluorine containing gas into the processing chamber, a purge process may be performed to avoid a reaction between the first or second precursor and the fluorine containing gas at a location other than a surface of the substrate. The purge process may be the same purge process between flowing the first and second precursors into the processing chamber.

The temperature of the substrate during operation 110 may be less than about 500 degrees Celsius, such as from about 20 degrees Celsius to about 400 degrees Celsius. The fluorine containing gas may start etching the surface of the substrate if the temperature of the substrate is greater than about 500 degrees Celsius. In some embodiments, the temperature of the substrate during operation 110 is the same as the temperature of the substrate during operations 104, 106 and 108. In other embodiments, the temperature of the substrate during operation 110 is lower than the temperature of the substrate during operations 104, 106 and 108.

The fluorine containing gas may be activated by a radio-frequency power to form a fluorine containing plasma. The plasma may be formed in-situ, i.e., in the processing region of the processing chamber, or remotely, i.e., in a location other than the processing region of the processing chamber. The in-situ plasma may be inductively coupled or capacitively coupled. In one embodiment, the fluorine containing gas is flowed into a remote plasma source of the processing chamber and is activated in the remote plasma source to form a remote plasma. The fluorine ions and radicals in the remote plasma are flowed from the remote plasma source to the processing region of the processing chamber.

The fluorine containing gas or the fluorine containing plasma may be utilized to incorporate fluorine molecules, ions or radicals into the high-k dielectric to form a fluorinated high-k dielectric. In one embodiment, the fluorine containing gas is utilized to incorporate fluorine molecules, ions or radicals into a high-k dielectric formed in a high aspect ratio feature in a device, such as a 3D NAND or a capacitor of a DRAM device. In another embodiment, the fluorine containing plasma is utilized to incorporate fluorine ions or radicals into a high-k dielectric formed in a device that does not have a high aspect ratio feature, such as a FinFET.

Operations 104, 106, 108 and 110 describe a method for forming a fluorinated high-k dielectric material, such as a fluorinated gate dielectric, using an ALD process. In some embodiments, more than two precursors are used to form a fluorinated high-k dielectric material that is tertiary or greater (i.e. has three or more elemental components), and the fluorine containing gas may be introduced between any two precursors flowing into the processing chamber. For example, three precursors are sequentially flowed into an ALD processing chamber to form a tertiary high-k dielectric material, such as $ZrAlO_x$. The first precursor may be flowed into the processing chamber and may form a monolayer on the substrate. The second precursor may be flowed into the processing chamber and may react with the monolayer. The third precursor may be flowed into the processing chamber and may react with a reaction product of the second precursor and the monolayer to form the tertiary high-k dielectric material. The fluorine containing gas may be flowed into the ALD processing chamber between flowing a first precursor into the ALD processing chamber and flowing a second precursor into the ALD processing chamber, between flowing the second precursor into the ALD processing chamber and flowing a third precursor into the ALD processing chamber, and/or between flowing the third precursor into the ALD processing chamber and flowing the first precursor into the processing chamber. The fluorine containing gas may be activated in the processing region of the processing chamber or in a remote plasma source connected to the processing chamber, and the tertiary high-k dielectric layer may be exposed to the fluorine containing gas or plasma during the growing of the tertiary high-k dielectric layer, forming the fluorinated tertiary high-k dielectric material. In some embodiments, the fluorinated high-k dielectric material is formed using chemical vapor deposition (CVD) or plasma enhanced chemical vapor deposition (PECVD) process, and the first and second precursors (or two or more precursors) and the fluorine containing gas may be introduced into the processing chamber simultaneously to form the fluorinated high-k gate dielectric in a batch process. In some embodiments, the fluorinated high-k gate dielectric is formed in a furnace, and the fluorine containing gas may be introduced into the furnace between any two cycles or after all cycles.

After the fluorinated high-k dielectric having a predetermined thickness, such as 20 Angstroms or 40 Angstroms, is formed, a dielectric capping layer may be deposited on the fluorinated high-k dielectric. The dielectric capping layer may be made of a material different than the material of the high-k dielectric. In one embodiment, the capping layer is a nitride, such as titanium nitride (TiN). An anneal process may be performed following the deposition of the capping layer. The anneal process may be a spike anneal process performed at a temperature of about 900 degrees Celsius, and the spike anneal process may be performed in vacuum condition or atmospheric condition. Following the anneal process, a gate electrode is deposited on the annealed capping layer. The gate electrode may be formed with any suitable material, such as polysilicon, amorphous silicon, or metal, such as titanium, titanium nitride, tantalum, tantalum nitride, tungsten, tungsten nitride, or other refractory metals.

Figure 2:
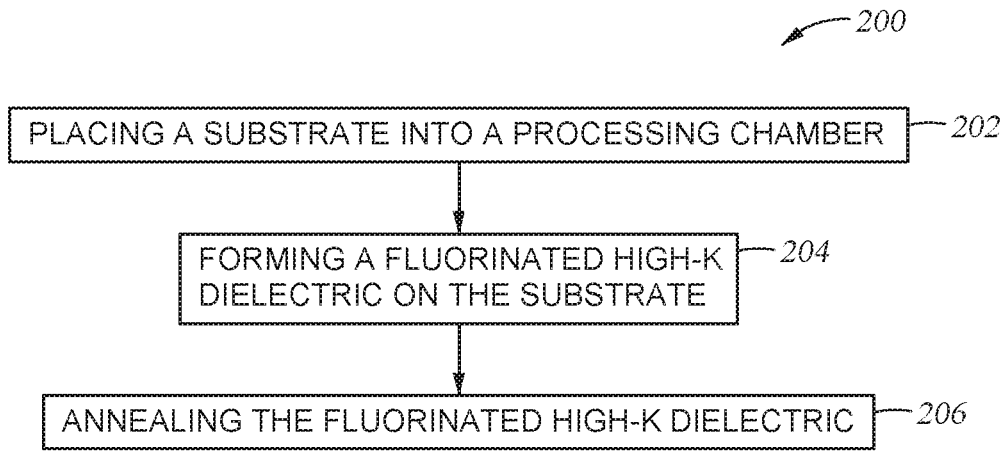
FIG. 2 illustrates operations of a method according to embodiments disclosed herein.

FIG. 2 illustrates operations of a method 200 according to embodiments disclosed herein. The method 200 starts at operation 202, which is placing a substrate into a processing chamber. The substrate and the processing chamber may be the same substrate and the processing chamber as described in FIG. 1. Next, at operation 204, a fluorinated high-k dielectric is formed on the substrate in the processing chamber. The operation 204 may be operations 104, 106, 108 and 110. Following the forming of the fluorinated high-k dielectric, a post fluorination anneal (PFA) may be performed on the fluorinated high-k dielectric, as shown in operation 206. During the PFA, the substrate including the fluorinated high-k dielectric is annealed at a temperature from about 300 degrees Celsius to about 700 Celsius, such as at about 600 degrees Celsius, for a time period from about 1 second to about 120 seconds, such as from about 30 seconds to about 90 seconds, for example, at about 600 degrees Celsius for about 30 seconds. Generally, at least one anneal gas, such as $O_2$, $N_2$, $NH_3$, $N_2H_4$, NO, $N_2O$, or combinations thereof, may be introduced into the processing chamber during the PFA. The processing chamber may be maintained at a pressure from about 1 Torr to about 760 Torr, for example, at about 50 Torr. The PFA helps to retain more fluorine in the fluorinated high-k dielectric by forming more metal-fluorine bonds, such as Hf—F bonds. Additionally, PFA helps to release any unbonded fluorine.

Following the PFA, a capping layer may be deposited on the annealed fluorinated high-k dielectric, another anneal process may be performed, and a gate electrode may be deposited, as described above.

Figure 3:
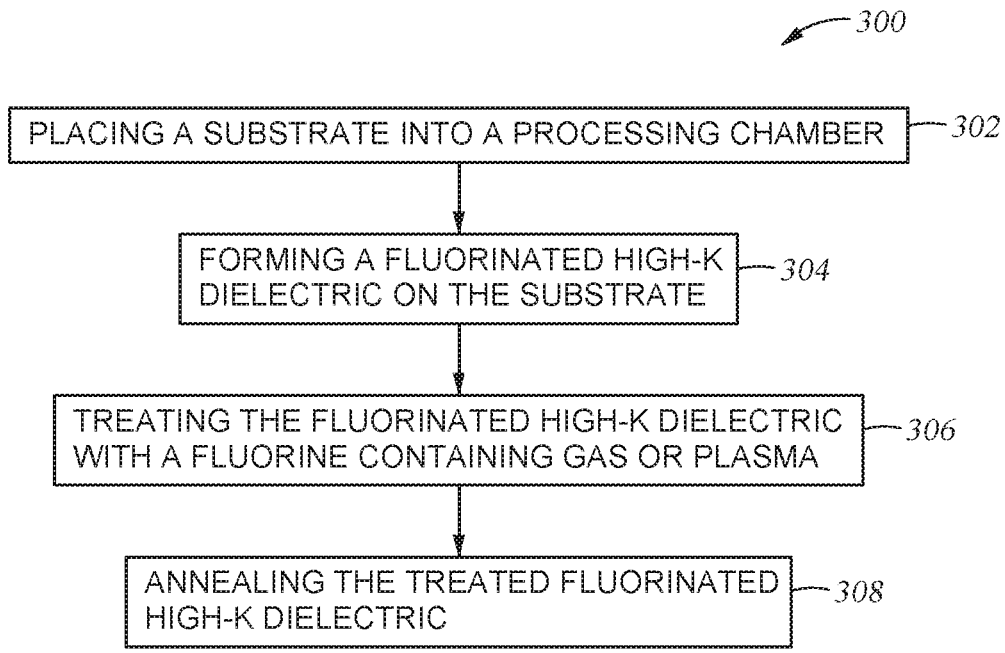
FIG. 3 illustrates operations of a method according to embodiments disclosed herein.

FIG. 3 illustrates operations of a method 300 according to embodiments disclosed herein. The method 300 starts at operation 302, which is placing a substrate into a processing chamber. The substrate and the processing chamber may be the same substrate and the processing chamber as described in FIG. 1. Next, at operation 304, a fluorinated high-k dielectric is formed on the substrate in the processing chamber. The operation 304 may be operation 204. Next, at operation 306, the fluorinated high-k dielectric is treated with a fluorine containing gas or plasma. The fluorine containing gas may include $NF_3$, $F_2$, HF or any suitable fluorine containing gas, and may be used to form the fluorine plasma. The fluorine containing gas may also include an inert gas such as argon, helium, neon, or xenon. The fluorine containing gas used in this process may be carbon free.

In one embodiment, the treating process proceeds at a time period from about 10 seconds to about 360 seconds, such as from about 30 seconds to about 180 seconds, for example, about 30 seconds. The treating process with the fluorine containing plasma may be performed at a substrate temperature less than 500 degrees Celsius, for example, between about 50 degrees Celsius and less than 500 degrees Celsius, such as about 100 degrees Celsius. Also, when a fluorine containing plasma is utilized, the radio frequency power setting ranges from about 50 watts to about 2,500, for example between about 50 watts to about 1000 watts, such as about 1000 watts. The chamber pressure may range from about 10 mTorr to about 100 mTorr, such as about 20 mTorr. The fluorine containing gas may have a flow rate from about 10 to 200 sccm. The carrier gas, such as helium, may have a flow rate ranging from about 200 sccm to about 400 sccm. The treating of the fluorinated high-k dielectric provides additional fluorine incorporation in the high-k dielectric. Following the treating of the fluorinated high-k dielectric, the treated fluorinated high-k dielectric may be annealed, as shown in operation 308. The operation 308 may be the same as operation 206.

Following the annealing of the treated fluorinated high-k dielectric, a capping layer may be deposited on the treated fluorinated high-k dielectric, an anneal process may be performed, and a gate electrode may be deposited, as described above.

Figure 4:
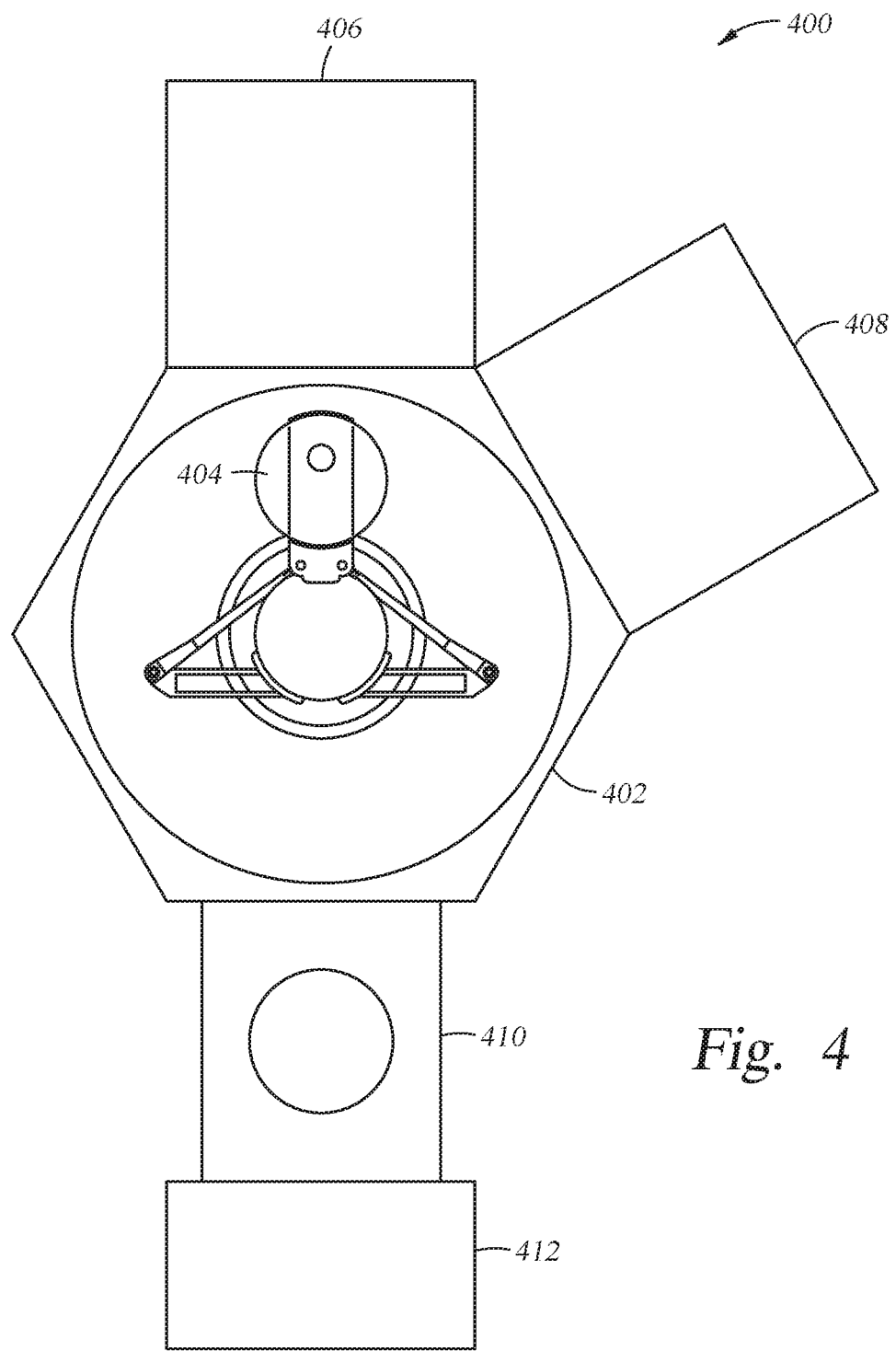
FIG. 4 illustrates a schematic top view of an apparatus that may be used to perform the methods described herein.

FIG. 4 illustrates a schematic top view of an apparatus 400 within which embodiments of the disclosure may be performed. The apparatus 400 may include a transfer chamber 402. Within the transfer chamber 402 is a substrate transferring mechanism 404. The substrate transferring mechanism 404 transfers a substrate, such as the substrate described in connection with FIG. 1, from a first processing chamber 406 to a second processing chamber 408, or from the first processing chamber 406 or the second processing chamber 408 to a load lock chamber 410 and vice versa. The first processing chamber 406 and second processing chamber 408 are connected to the transfer chamber 402. The load lock chamber 410 is connected to a factory interface 412. In one embodiment, the first processing chamber 406 is a deposition chamber and the second processing chamber 408 is a treatment chamber. Operations 104, 106, 108 and 110 described in FIG. 1 may be performed in the first processing chamber 406. Operation 206 described in FIG. 2 and operations 306 and 308 described FIG. 3 may be performed in the second processing chamber 408. The first processing chamber 406, the second processing chamber 408, and the transfer chamber 402 may be under vacuum condition. Thus, when transferring the substrate from one processing chamber to the other processing chamber, vacuum condition is not broken, reducing the chance of contamination.

While the foregoing is directed to embodiments of the present disclosure, other and further embodiments of the disclosure may be devised without departing from the basic scope thereof, and the scope thereof is determined by the claims that follow.

What is claimed is:

1. A method, comprising:
   flowing a first precursor into a processing chamber;
   exposing a substrate to the first precursor to form a monolayer containing the first precursor on the substrate disposed in the processing chamber; then
   flowing a second precursor into the processing chamber;
   exposing the substrate to the second precursor to react the second precursor with the first precursor of the monolayer and form a dielectric layer on the substrate;
   sequentially repeating exposing the substrate to the first and second precursors to grow the dielectric layer to a predetermined thickness; and
   exposing the substrate to a fluorine containing gas while growing the dielectric layer and incorporating fluorine into the dielectric layer, wherein the substrate is exposed to the fluorine containing gas between flowing the first precursor into the processing chamber and flowing the second precursor into the processing chamber.

2. The method of claim 1, wherein the dielectric layer having the predetermined thickness is a fluorinated high-k dielectric.

3. The method of claim 2, wherein the dielectric layer having the predetermined thickness is fluorinated hafnium oxide.

4. The method of claim 1, wherein the first precursor comprises hafnium, zirconium, titanium, tantalum, lanthanum, aluminum, or silicon.

5. The method of claim 4, wherein the fluorine containing gas comprises fluorine gas, tetrafluoromethane, or nitrogen trifluoride.

6. The method of claim 1, further comprising flowing a third precursor into the processing chamber, and the dielectric layer is formed by reacting the third precursor with a reaction product of the second precursor and the monolayer, and the fluorine containing gas is introduced into the processing chamber between flowing the first precursor into the processing chamber and flowing the second precursor into the processing chamber, between flowing the second precursor into the processing chamber and flowing the third precursor into the processing chamber, and between flowing the third precursor into the processing chamber and flowing the first precursor into the processing chamber.

7. The method of claim 1, wherein the predetermined thickness of the dielectric layer is about 20 Å to about 40 Å.

8. A method, comprising:
   flowing a first precursor into a processing chamber containing a substrate;
   exposing the substrate to the first precursor to form a monolayer containing the first precursor on the substrate; then
   flowing a second precursor into the processing chamber;
   exposing the substrate to the second precursor to react the second precursor with the first precursor of the monolayer and form a dielectric layer on the substrate;
   sequentially repeating exposing the substrate to the first and second precursors to grow the dielectric layer to a predetermined thickness; and
   exposing the substrate to a fluorine containing plasma while growing the dielectric layer and incorporating fluorine into the dielectric layer, wherein the substrate is exposed to the fluorine containing plasma between flowing the first precursor into the processing chamber and flowing the second precursor into the processing chamber.

9. The method of claim 8, wherein the first precursor comprises hafnium, zirconium, titanium, tantalum, lanthanum, aluminum or silicon.

10. The method of claim 8, wherein the fluorine containing plasma is formed by flowing a fluorine containing gas into a processing region of the processing chamber and activating the fluorine containing gas in the processing region, wherein the fluorine containing gas comprises fluorine gas, tetrafluoromethane, or nitrogen trifluoride.

11. The method of claim 8, wherein the fluorine containing plasma is formed by flowing a fluorine containing gas into a remote plasma source of the processing chamber and activating the fluorine containing gas in the remote plasma source, wherein the fluorine containing gas comprises fluorine gas, tetrafluoromethane, or nitrogen trifluoride.

12. The method of claim 8, wherein the fluorine containing plasma is formed by flowing a fluorine containing gas into a processing region of the processing chamber between flowing the first precursor into the processing chamber and flowing the second precursor into the processing chamber and activating the fluorine containing gas in the processing region.

13. The method of claim 8, wherein the fluorine containing plasma is formed by flowing a fluorine containing gas into a remote plasma source of the processing chamber between flowing the first precursor into the processing chamber and flowing the second precursor into the processing chamber and activating the fluorine containing gas in the remote plasma source.

14. The method of claim 8, further comprising flowing a third precursor into the processing chamber.

15. The method of claim 14, wherein the dielectric layer is formed by reacting the third precursor with a reaction product of the second precursor and the monolayer.

16. The method of claim 15, wherein the fluorine containing plasma is formed by flowing a fluorine containing gas into a processing region of the processing chamber between flowing the first precursor into the processing chamber and flowing the second precursor into the processing chamber, between flowing the second precursor into the processing chamber and flowing the third precursor into the processing chamber, and between flowing the third precursor into the processing chamber and flowing the first precursor into the processing chamber, wherein the fluorine containing gas is activated in the processing region.

17. The method of claim 15, wherein the fluorine containing plasma is formed by flowing a fluorine containing gas into a remote plasma source of the processing chamber between flowing the first precursor into the processing chamber and flowing the second precursor into the processing chamber, between flowing the second precursor into the processing chamber and flowing the third precursor into the processing chamber, and between flowing the third precursor into the processing chamber and flowing the first precursor into the processing chamber, wherein the fluorine containing gas is activated in the remote plasma source and the fluorine containing plasma is flowed from the remote plasma source to a processing region of the processing chamber.

18. The method of claim 8, wherein the predetermined thickness of the dielectric layer is about 20 Å to about 40 Å.

19. A method, comprising:
repeating a cycle during an atomic layer deposition process to form a dielectric layer on a substrate within a processing chamber, wherein the cycle comprises:
exposing the substrate to a first precursor to form a monolayer of the first precursor on the substrate; then
exposing the substrate to a second precursor to react the second precursor with the first precursor of the monolayer and form a dielectric layer on the substrate; and
sequentially repeating exposing the substrate to the first and second precursors to form the dielectric layer to a predetermined thickness; and
exposing the substrate to a fluorine containing gas between exposing the substrate to the first precursor and exposing the substrate to the second precursor, wherein the fluorine containing gas is different than the first and second precursors.

20. The method of claim 19, wherein the fluorine containing gas comprises fluorine gas, tetrafluoromethane, or nitrogen trifluoride.

* * * * *